United States Patent [19]

Pelgrom et al.

[11] Patent Number: 5,079,552
[45] Date of Patent: Jan. 7, 1992

[54] DIGITAL-TO-ANALOG CONVERTER

[75] Inventors: Marcellinus J. M. Pelgrom; Martien van der Veen, both of Eindhoven, Netherlands

[73] Assignee: U.S. Philips Corporation, New York, N.Y.

[21] Appl. No.: 624,386

[22] Filed: Dec. 4, 1990

[30] Foreign Application Priority Data

Jan. 11, 1990 [NL] Netherlands .................. 9000076

[51] Int. Cl.[5] ............................................. H03M 1/76
[52] U.S. Cl. ......................................... 341/148; 341/144
[58] Field of Search .................... 341/144, 148, 153, 154

[56] References Cited

U.S. PATENT DOCUMENTS

| | | | |
|---|---|---|---|
| 3,997,892 | 12/1976 | Susset | 341/148 X |
| 4,146,882 | 3/1979 | Hoff, Jr. et al. | 341/148 X |
| 4,160,244 | 7/1979 | Solomon et al. | 341/148 |
| 4,366,470 | 12/1982 | Takanashi et al. | 341/148 X |
| 4,393,370 | 7/1983 | Hareyama | 341/148 X |
| 4,523,180 | 6/1985 | Kuboki | 341/148 X |
| 4,607,249 | 8/1986 | Naylor et al. | 341/144 X |
| 4,607,250 | 8/1986 | Naylor et al. | 341/144 X |
| 5,014,054 | 5/1991 | Oshita et al. | 341/153 X |

*Primary Examiner*—Howard L. Williams
*Attorney, Agent, or Firm*—Edward W. Goodman

[57] ABSTRACT

Digital-to-analog converter having a reference voltage divider and a selection circuit by which the voltage at one of the nodal points of the reference voltage divider can be switched-through to the output of the converter. The selection circuit is controlled by selection signals coming from a decoder circuit by which the digital input signal is decoded. In addition, the converter includes a bias voltage divider which can apply different bias voltages to a level shifting circuit by which the signal level of the selection signals can be shifted.

24 Claims, 7 Drawing Sheets

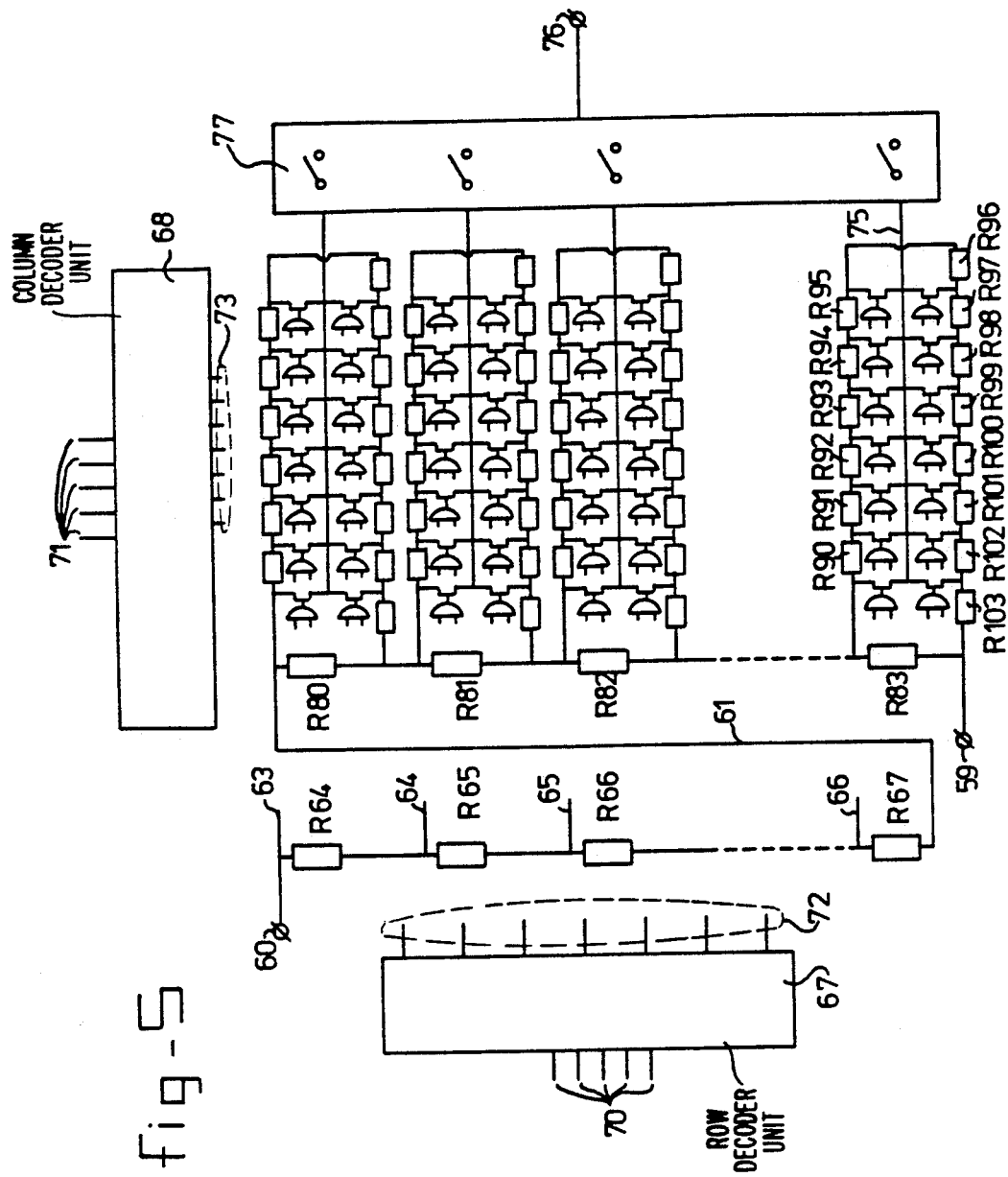

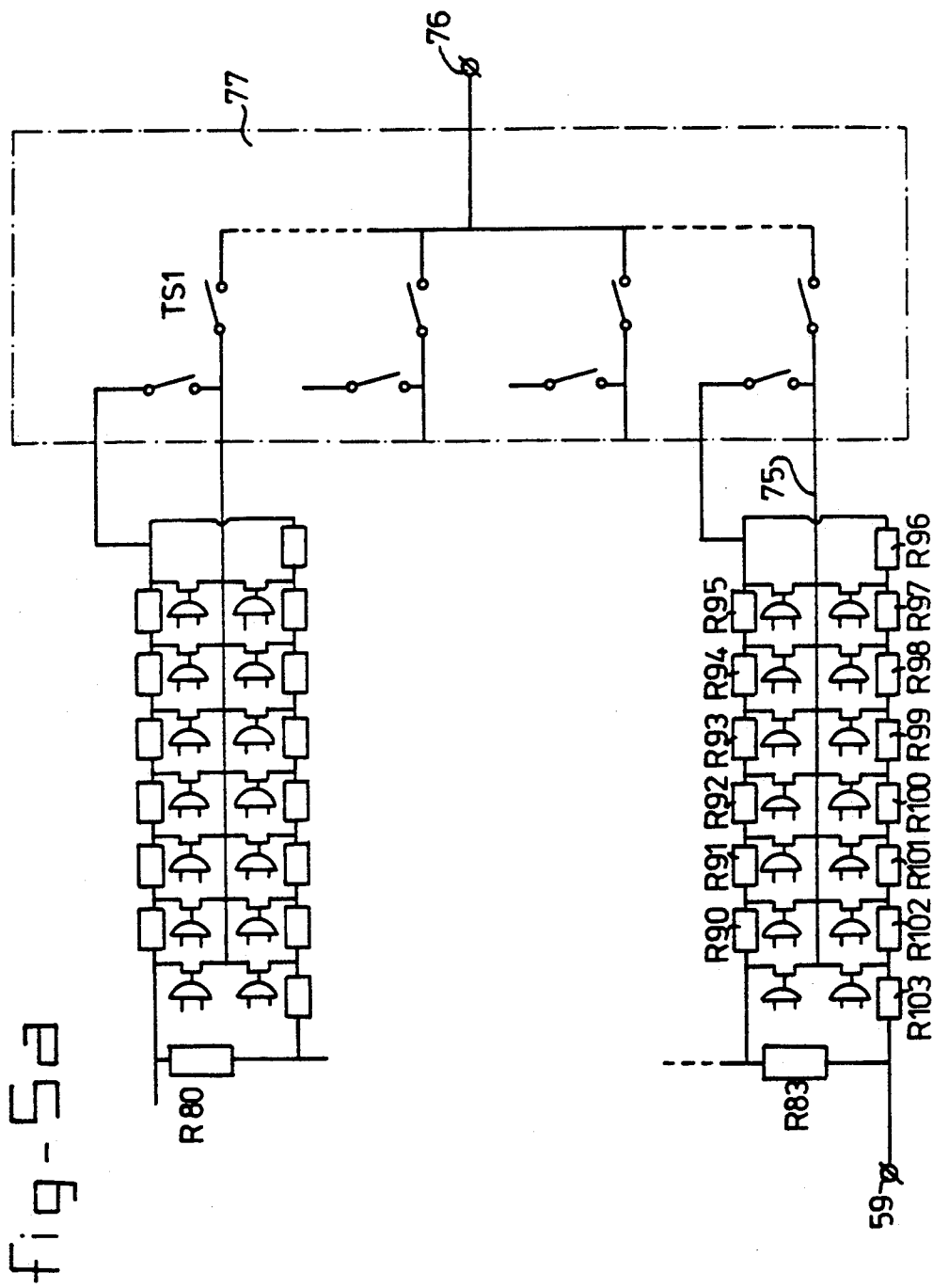

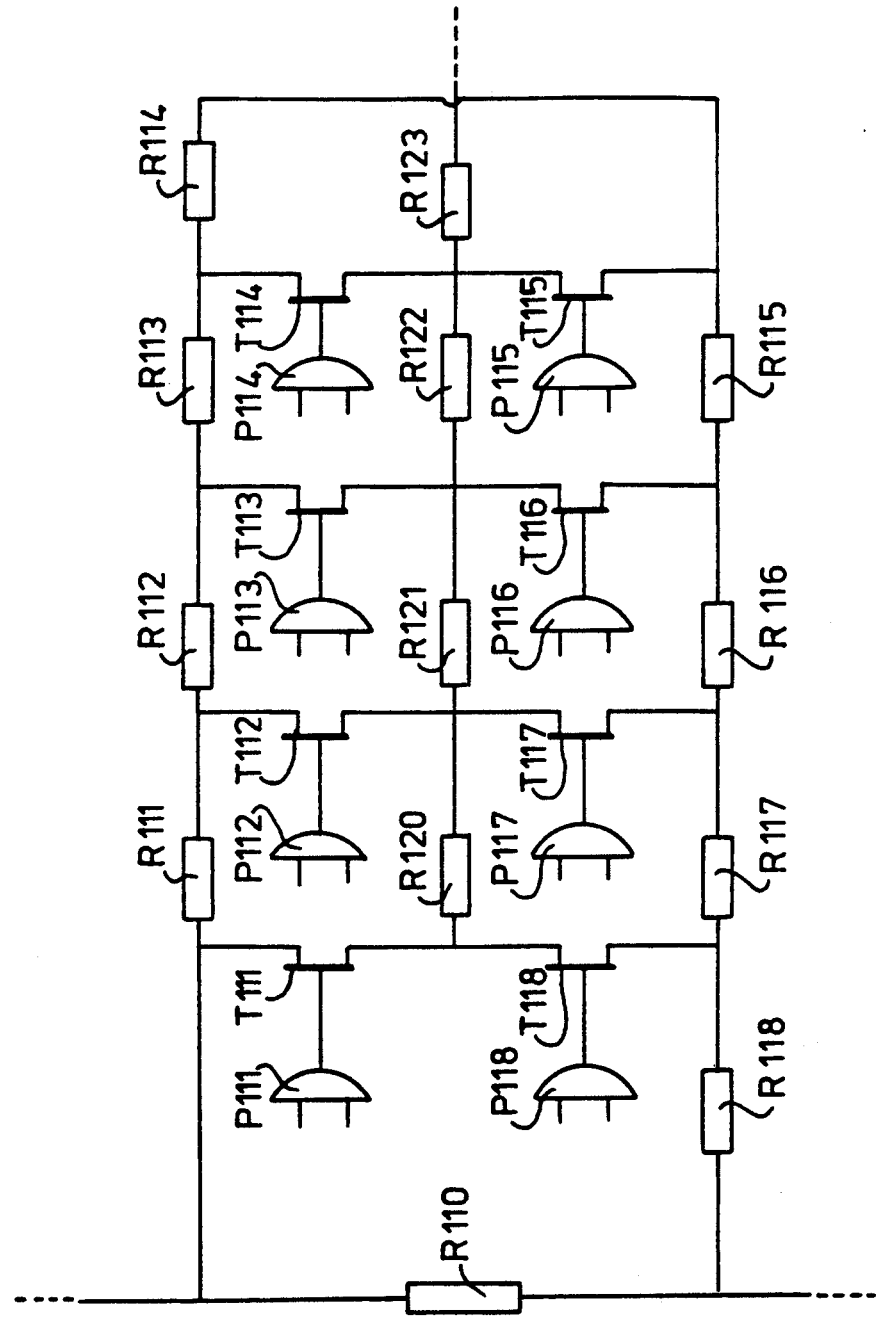

DIGITAL-TO-ANALOG CONVERTER

FIELD OF THE INVENTION

The invention relates to a digital-to-analog converter for converting a digital input signal into an analog output signal, comprising
- an input for connection of the digital input signal and an output from which the analog output signal can be taken,
- a reference voltage divider assembled from a series arrangement of resistance elements interconnected in nodal points, the reference voltage divider having at the ends of the series arrangement terminals for connection of a reference voltage,
- a selection circuit for coupling one of the nodal points to the analog output in response to selection signals, comprising switching transistors a first main electrode of which is coupled to one of the nodal points, a second main electrode to the analog output and a control electrode to one of the selection signals, and
- a decoder circuit for activating the selection signals in response to the digital input signal.

BACKGROUND OF THE INVENTION

Such a digital-to-analog (DA) converter is known under the type designation PNA 7518 and operates in accordance with the known parallel selection system. Herein the reference voltage divider divides the reference voltage into a plurality of equal steps which are available at the nodal points which are connected to the analog output via the switching transistors. Depending on the digital input signal, the decoder circuit activates one of the switching transistors, as a result of which the value of the analog output signal corresponds to the voltage across the relevant nodal point.

This type of DA converter is of a simple structure since always only one switching transistor needs to be activated. However, the signal quality of the analog output signal is reduced by signal distortion as a result of a signal level-dependent RC-time constant of the charging circuit by means of which the parasitic capacitance at the analog signal output is charged and also by switching noise caused by turning on and off of the switching transistors and by the current surges with which the parasitic capacitance is charged. The signal quality reduction limits the effective bit-resolution and-/or the processing rate of this prior-art DA-converter.

The parasitic capacitance is always charged or discharged to a different analog signal voltage via a series resistor the effective value of which depends on the position of the selected nodal point on the reference voltage divider. The rate at which the voltage at the analog output can change its value is not the same for all the signal levels. The characteristic staircase (shaped) noise signal at the analog output signal consequently includes components having frequencies which are located in the useful band of the analog output signal which cannot be filtered off by means of the customary low-pass filter. These components manifest themselves as a distortion of the analog output signal which is relatively ever increasing versus an increasing bit-resolution or versus an increasing processing rate of this type of DA-converter.

A first cause of the signal level-dependent series resistance in the charging circuit is the ever changing effective output resistance in the nodal points of the reference voltage divider. In the center, the output resistance is at its maximum, at the ends it is at its minimum. A second cause is the varying forward resistance between the first and the second main electrode of the switching transistors. The selection signals for the control electrodes of all the switching transistors are all of the same value. However, the voltage between the control electrode and the first main electrode, which is decisive for the forward resistance of the switching transistor, varies because the first main electrodes are connected to different taps of the reference voltage divider.

SUMMARY OF THE INVENTION

The invention has for its object to improve the signal quality of the analog output signal and thus to render the prior-art type of DA-converter more suitable for a higher bit-resolution and/or processing rate.

According to the invention, with a DA-converter of the type defined in the opening paragraph, this object is achieved in that the analog-to-digital converter further includes: includes:
- a bias voltage divider formed by a series arrangement of resistance elements interconnected in nodal points, the bias voltage divider at the ends of the series arrangement having terminals for connection of a bias voltage, and
- a level shifting circuit, comprising shifting stages, each having an input terminal, an output terminal and a supply terminal, for shifting a signal level at the input terminal to a different signal level at the output terminal in dependence on the voltage connected to the supply terminal, the input terminals being connected to the selection signals, the output terminals being connected to the control electrodes of the switching transistors corresponding to the selection signals and the supply terminals being connected to the nodal points of the bias voltage divider.

The shifting stages convert the amplitude of the selection signals of the decoder circuit into signals whose amplitude is determined by the voltage at the nodal point of the bias voltage divider with which the relevant shifting stage or shifting stages are fed. Acting thus it is achieved that the effective voltage between the control electrode and the first main electrode of the switching transistors varies to a less extent, so that the forward resistance between the first and the second main electrodes also varies to a less extent. This effect can already be obtained by connecting the shifting stages group-wise to the same nodal point of the bias voltage divider. The variation is at its lowest in an embodiment of a DA-converter according to the invention, which is characterized in that the series arrangement of the bias voltage divider has the same number of nodal points as the series arrangement of the reference voltage divider.

The shifting stages can be realized in several embodiments. A second embodiment of a DA-converter according to the invention, is characterized for this object, in that the shifting stages each include a transistor a first and a second main electrode of which are connected to the output terminal and the supply terminal, respectively, and a control electrode to the input terminal of the relevant shifting stage. Logic gate circuits are adequately suitable circuit components having active high and low output voltages, so that the control electrodes of the non-selected switching transistors do not float or are not unintentionally activated by crosstalk from other selection signals.

The amplitude of the output signal of the logic gate circuits depends on the supply voltage thereof. By now feeding the logic gate circuits from the nodal points of the bias voltage divider it is achieved that the signal amplitude of the incoming selection signal is converted into a signal amplitude, which varies versus the voltage at the nodal points, of the outgoing selection signal.

A third embodiment of a DA-converter according to the invention, is characterized, in that sub-arrangements of equal numbers of consecutive resistance elements of the series arrangement of the reference voltage divider are arranged in groups, the second main electrodes of the switching transistors within the groups being coupled to the analog output via a group bus bar, that the decoding circuit includes a row decoder and a column decoder to activate row selection signals and column selection signals, respectively, that the logic gate circuits are provided with a further logic input which is connected to a further input terminal of the shifting stages, in each of the said groups the said first input terminals all being connected to one of the row selection signals and the further input terminals to different column selection signals. The DA-converter is structured as a matrix with row and column decoding of the digital input signal, the switching transistors being arranged in groups with a group bus bar. As a result thereof the number of selection signals is considerably reduced. This reduces the switching noise in the analog output signal as a result of which the signal quality thereof increases.

A fourth embodiment of a DA-converter according to the invention, is characterized, in that a parallel resistance element is arranged in parallel with the sub-arrangements. The parallel resistors reduce on the one hand the impedance level of the reference voltage divider and on the other hand the variation in the effective output impedance in the nodal points of the reference voltage divider is reduced. An additional advantage is that the reference voltage divider can now be realized with resistance values which are attractive for integration without exceeding a predetermined maximum output resistance.

A fifth embodiment of a DA-converter in accordance with the invention, is characterized, in that the group bus bar is connected via a group switch to the analog output on activation of the row selection signal associated with the group. The group switches isolate the non-active groups from the analog signal output as a result of which the parasitic capacitance at that output is less. The current surges with which the parasitic capacitance is charged, are then correspondingly less, so that the switching noise in the analog output signal decreases. In addition, the influence of the varying RC-time becomes relatively less.

A sixth embodiment of a DA-converter, is characterized, in that the relevant group further includes a hold switch which connects the group bus bar to a point of fixed potential during non-activation of the row selection signal associated with the group. The hold switches connect the group bus bars of non-selected groups to a fixed potential which preferably is equal to the potential prevailing halfway the sub-arrangements of the relevant group. This prevents drift of the bus bar potential to unwanted highly deviating voltages which must again be equalized on selection of the group, accompanied by unnecessarily much switching noise.

A further reduction of the variation in the RC-time constant can be obtained using an embodiment of a DA-converter in accordance with the invention, which is characterized in that the group bus bar is designed as a array of resistance elements interconnected in nodal points, the second main electrodes of the switching transistors of the group being connected to these nodal points. The resistance elements in the bus bar compensate the output impedance variation in the nodal points of the reference voltage divider.

The forward resistance between the first and the second main electrode of the switching transistors also depends on the threshold voltage of the transistors. An embodiment of a DA-converter in accordance with the invention, is characterized in that a substrate connection of the switching transistors is connected to a nodal point f the reference voltage divider. By feeding the substrates with a voltage which varies versus the control electrode and the first main electrode, the threshold voltages of the switching transistors become mutually equal to a better extent, causing the variation in the forward resistance to become less.

BRIEF DESCRIPTION OF THE DRAWINGS

The invention will now be described in greater detail with reference to the accompanying Figures, wherein:

FIG. 5 shows a fourth embodiment of a DA-converter with row and column addressing;

FIG. 5A shows a schematic circuit diagram a possible arrangement of the switching network 77 in FIG. 5; and FIG. 6 shows a schematic circuit diagram of an alternate embodiment of a group bus bar arrangement of one of the portions of the fine ladder network of FIG. 5.

DESCRIPTION OF PREFERRED EMBODIMENTS OF THE INVENTION

Figure 1:
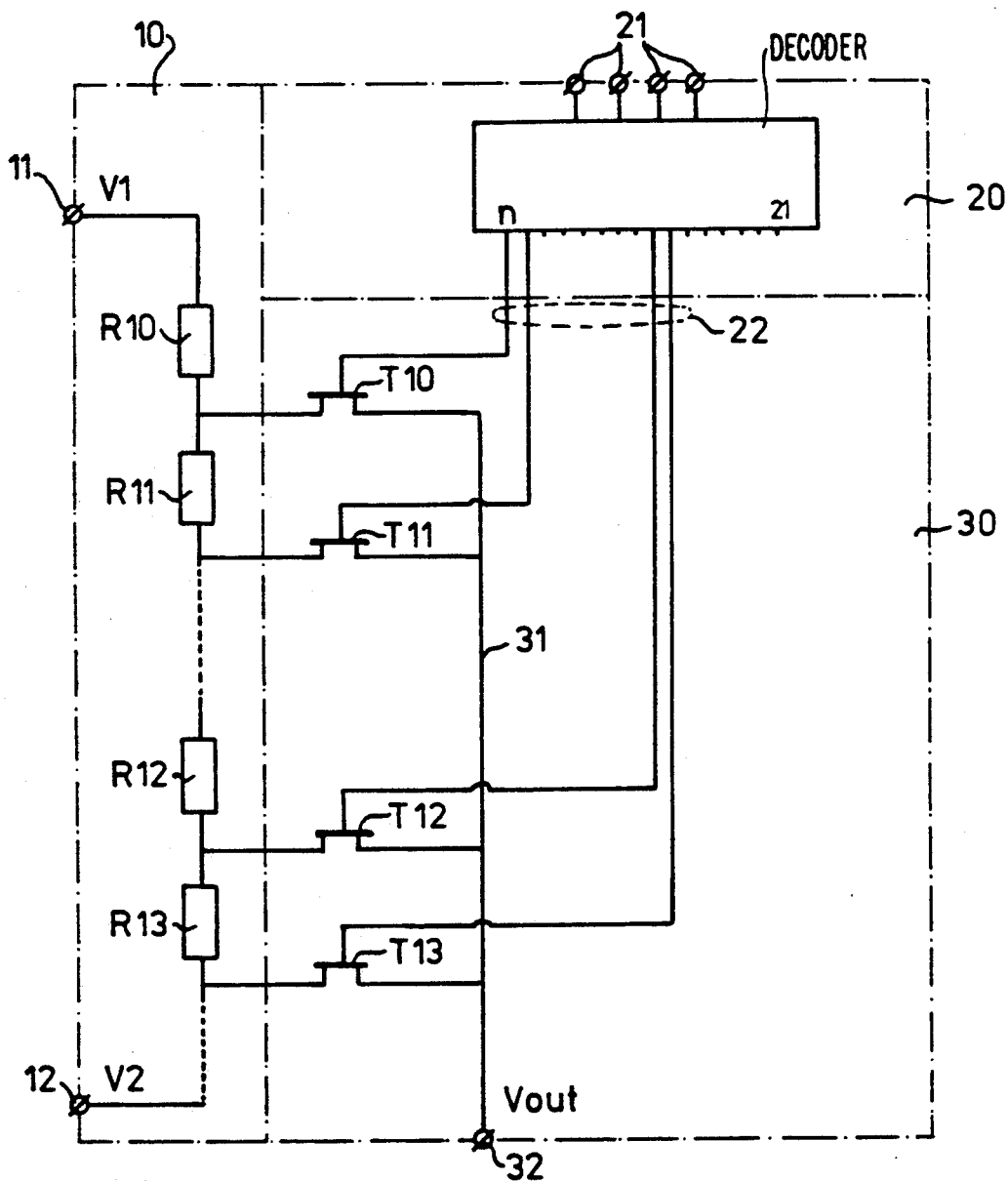
FIG. 1 shows a prior-art DA-converter.

FIG. 1 shows a digital-to-analog converter which is known from the prior art and is of the type marketed by Applicants under the type designation PNA 7518. This digital-to-analog converter includes a reference voltage divider 10, formed by an array of series-arranged resistors, of which the resistors R10, R11, R12 and R13 are shown separately in FIG. 1. The ends 11 and 12 of the reference voltage divider are connected during operation to a high potential V1 and to a low potential V2, respectively. The nodal points of this reference voltage divider are connected to a selection circuit 30 constituted by a plurality of CMOS-transistors, each connected between a nodal point of the reference voltage divider 10 and a bus bar 31, which is connected to an output terminal 32 across which the voltage $V_{out}$ becomes available. FIG. 1 shows the CMOS-transistors T10, T11, T12 and T13 of the selection circuit.

In addition, the digital-to-analog converter in FIG. 1 includes a decoder circuit 20 by means of which a n-bit digital input signal which is applied to the inputs 21, is converted into an l-bit signal which becomes available at one of the $2^n$ outputs 22 of the decoder unit 20. Each output of the decoder unit 20 is connected to a gate of one of the CMOS-transistors in the selection circuit 30. FIG. 1 shows the connections between the decoder unit 20 and the transistors T10, T11, T12, T13.

In operation, predetermined potentials V1 and V2 are applied to the ends of the reference voltage divider and a digital input signal is applied to the inputs 21. This digital input signal is decoded by the decoder unit 20 into one single signal at one of the outputs 22 and this signal is used to render one of the CMOS-transistors in the selection circuit conductive. This results in the voltage at the node to which this CMOS-transistor is connected being transferred to the bus bar 31 and becoming available as $V_{out}$ at the output 32 of the digital-to-analog converter.

If it is assumed that the decoder unit 20 supplies control voltages of equal levels from each of the outputs 22, then it will be obvious that each of the transistors T10 . . . T13 in the selection circuit operates with a different gate-source voltage $V_{gs}$, which $V_{gs}$ depends on the node to which the relevant CMOS-transistor is connected. This varying $V_{gs}$ results in a varying forward resistance of the CMOS-transistors, so that the resistance with which the parasitic capacitance of the output 32 is charged or discharged depends on the instantaneous signal level to be converted. The rate at which the voltage at the analog output can change value is not of the same magnitude for all signal levels. The characteristic staircase noise signal in the analog output signal consequently contains components having frequencies incorporated in the useful band of the analog output signal which cannot be filtered off with the aid of the customary low-pass filter. These components manifest themselves as a distortion of the analog output signal which, at an increasing bit-resolution or at an increasing processing rate of this type of DA-converter is relatively ever increasing.

Figure 2:
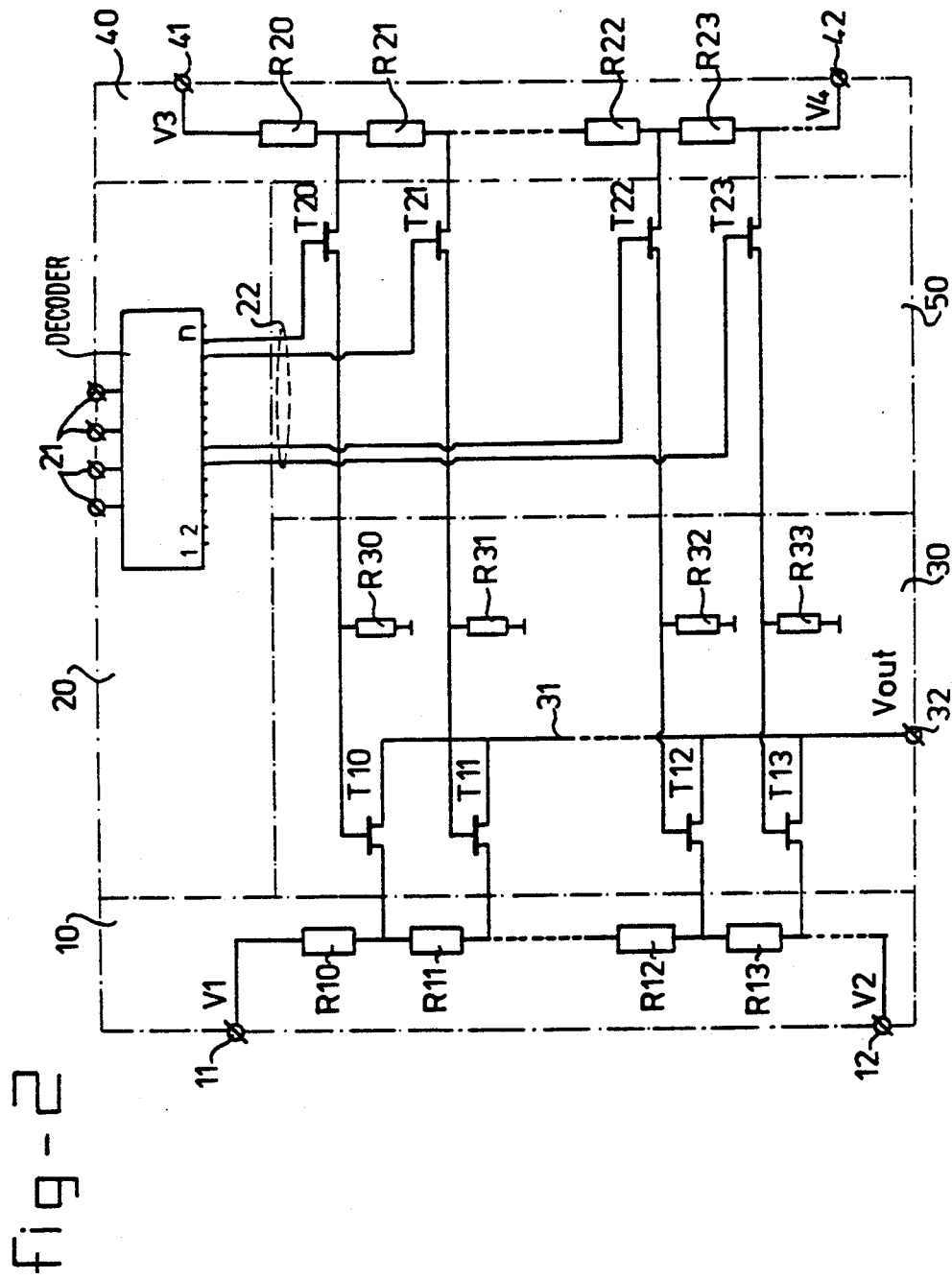
FIG. 2 shows a first embodiment of a DA-converter in accordance with the invention.

FIG. 2 shows an embodiment of an arrangement in accordance with the invention in which the disadvantage described indicated in the foregoing is eliminated or at least is reduced to a significant extent. Components corresponding to those shown in FIG. 1, are given the same reference numerals in FIG. 2.

In addition to the components already shown in FIG. 1, the arrangement of FIG. 2 also includes a bias voltage divider 40 the resistors R20, R21, R22, R23 of which are shown in FIG. 2. The ends 41 and 42 of this bias voltage divider are connected during operation to a potential V3 and a potential V4, respectively. The nodal points of the bias voltage divider 40 are connected to semiconductor switching elements which form part of a level shifting circuit 50. These semiconductor switching elements may be formed by CMOS-transistors as shown in FIG. 2, but they may optionally be constituted by different components. The transistors T20, T21, T22 and T23 of this level shifting circuit are shown in the Figure.

In contradistinction to FIG. 1, the outputs 22 of the decoder circuit 20 are not connected to the gate terminals of the transistors of the selection circuit 30 but are connected to the gate terminals of transistors of the level shifting circuit 50. The drain terminals of the transistors of the level shifting circuit 50 are connected to gate terminals of transistors of the selection circuit 30. The connections between the source terminals of the level shifting circuit 50 and the gate connections of the selection circuit 30 have been made such that the source terminals of the consecutive transistors T20 . . . T23 in the level shifting circuit 50 are connected, in this sequence, to the gate terminals of the consecutive transistors T10 . . . T13 of the selection circuit 30. To prevent the gates of the non-selected transistors of the selection circuit 30 from starting to float, all the gates of the selection circuit 30 are connected to grounded resistors R30, R31, R32, R33, (or to resistors connected to a different suitable potential).

If the number of resistors in the bias voltage divider is chosen to be equal to the number of resistors in the reference voltage divider and if also the resistance ratios are chosen to be equal, then, with a suitable choice of the various potentials V1 . . . V4, a different predetermined voltage will be applied to each of the gate terminals of the transistors T10 . . . T13. For each of the transistors T10 . . . T13 this voltage is such that the source-gate voltage of each of these transistors is at least predominantly equal. The result thereof is that this gate-source voltage does not cause any distortion during the transfer of the potential from one of the nodal points of the reference voltage divider to the bus bar 31 from which the output voltage $V_{out}$ is taken.

Figure 3:
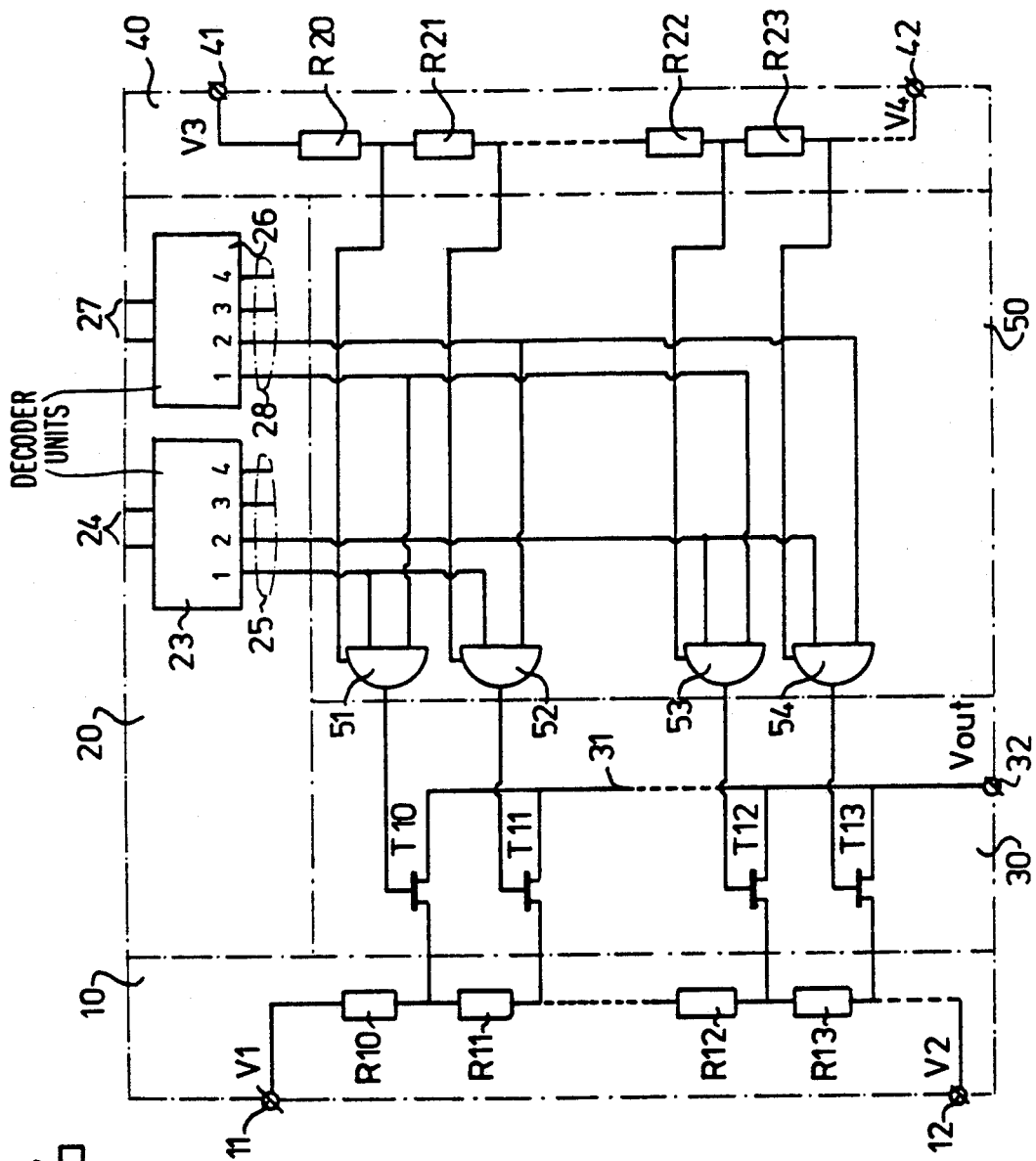
FIG. 3 shows a second embodiment of a DA-converter in accordance with the invention.

A still further embodiment of a digital-to-analog converter according to the invention is shown in FIG. 3. The digital-to-analog converter of FIG. 3 also comprises the reference voltage divider 10, the decoder unit 20, the selection circuit 30, the bias voltage divider 40 and a level shifting circuit 50. The differences between the embodiments shown in the FIGS. 2 and 3 are the structures of the decoder unit 20 and the level shifting circuit 50. In this embodiment the level shifting circuit 50 is provided with a plurality of gates, all of which are shown in FIG. 3 denoted by 51, 52, 53, 54. The output of each gate is connected to the gate terminal of one of the transistors of the selection circuit 30 in the manner illustrated in FIG. 3. The inputs of the two gates are controlled by signals supplied by the decoder circuit 20.

In this embodiment the decoder circuit 20 includes two decoder units 23 nad 26. The decoder unit 23 recieve s a binary input signal at the inputs 24 and decodes it to a signal at one of the outputs 25. The decoder unit 26 operates in a similar manner. The binary signal signal at one of the outputs 28. The outputs 25 and 28 are connected such to the inputs of the several gates 51 . . . 54 in the level shifting circuit 50 that the binary input signal at the inputs 24 of the unit 23 is used to select a group of gates in the level shifting circuit 50, while the binary signal at the inputs 27 is used to select one of the gates within the selected group.

In addition, the gates 51 . . . 54 are supplied with voltages obtained from the bias voltage divider 40. In the example the gates of the level shifting circuit 50 are in the form of AND-gates. If the two input signals are present at the inputs of the gate, in other words, the relevant gate has been selected by means of the decoder unit 20, then the output voltage of the relevant gate is equal to (or related to) the said gate supply voltage originating from the bias voltage divider 40. Also in this embodiment this achieves that the voltage applied to the gate terminals of the transistors within the selection circuit 30 depends on the location within the selection circuit 30, more specifically in such a manner that the gate-source voltage of each of the transistors in the selection circuit 30 is at least predominantly equal. Because of the use of logic gate circuits further active, well-defined high and low selection voltages are applied to the selection circuit 30, so that therein floating of the control electrodes of non-selected transistors is prevented.

It should be noted that AND-gates are used in FIG. 3. Within the scope of the invention it is however alternatively possible to use different types of gates with a similar result.

Both in the digital-to-analog converter of FIG. 2 and in the digital-to-analog converter of FIG. 3 it is possible to integrate the two voltage dividers into one integral resistive ladder network by connecting in both Figures the terminal 42 to the terminal 11. For the sake of clearness, this through-connection is not shown in the Figures. An additional advantage is that in that case only two terminals are required to which predetermined potentials must be applied, namely the terminal 41 to which a relatively high potential V3 must be applied and the terminal 2 to which a relatively low potential V2 is to be applied.

Figure 4:
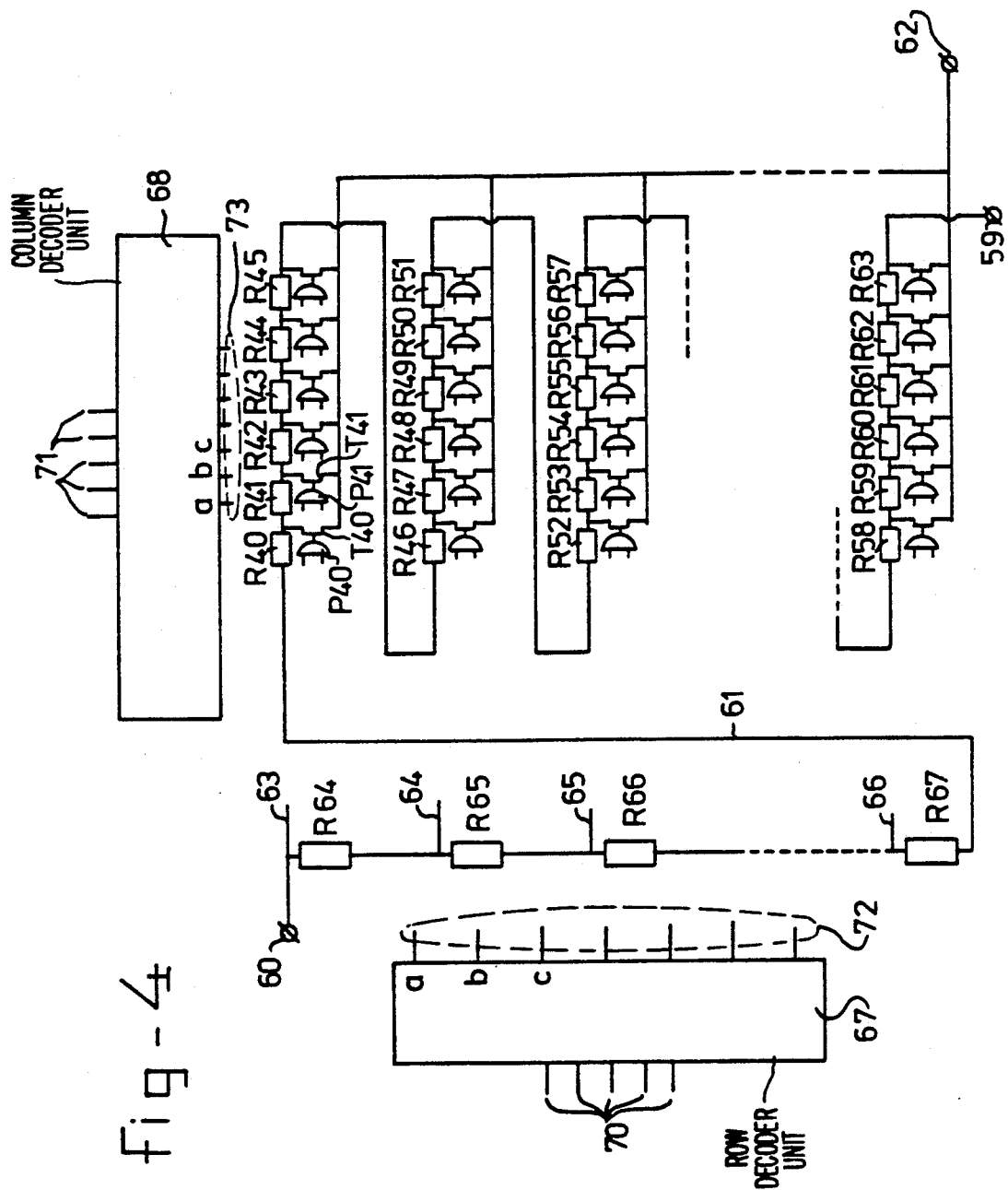
FIG. 4 shows a third embodiment of a DA-converter in accordance with the invention.

The digital-to-analog converter according to the invention can alternatively be employed with a smaller number of resistors in the bias voltage divider 40. An example thereof is shown in FIG. 4. The reference voltage divider in FIG. 4 is formed by the resistors R40, R41, ... R63, which are arranged in series between a connecting line 61 and a terminal 59. The bias voltage divider is formed by the resistors R64, R65, ... R67 which are connected between a terminal 60 and the aforementioned connecting line 61. In the manner described in the foregoing, this connecting line provides a through-connection between the two voltage dividers, in such a manner that actually one voltage divider is formed between the terminals 59 and 60.

A selection transistor and a selection gate are associated with each of the resistors R40, ... R63 of the reference voltage divider. The selection transistors T40, ... T63 together form the said selection circuit, and the selection gates P40, ... P63 together form the level shifting circuit. For the sake of clearness, the reference numerals are only indicated at the transistors T40, T41 and the gates P40, P41. The transistors and gates associated with the other resistors have references whose numerical portion corresponds to that of the associated resistors.

As will be obvious from FIG. 4, the resistors of the reference voltage divider are arranged in rows and columns, the uppermost row being determined by the resistors R40, ... R45 and the left-hand column being determined by the resistors R40, R46, R52, ... R58. For the addressing of the several gates use is made of a decoder unit which is divided into a row-decoder unit 67 and a column-decoder unit 68. The row-decoder unit 67 has the inputs 70 and the outputs 72 and the column-decoder unit 68 has the inputs 71 and the outputs 73. The uppermost output 72a of the row-decoder unit 67 is connected to one input of all the gates of the uppermost row, namely the gates P40, ... P45. The output 72b of the row-decoder unit 67 is connected to one input of all the gates associated with the second row, namely the gates P46, ... P51, etc. The lefthand output 73a of the column-decoder unit 68 is connected to one input of all the gates which are associated with the outermost lefthand column, namely the gates P40, P46, P52, ... P58. The output 73b of the column-decoder unit 68 is connected to one input of the gates associated with the left-hand but one column, namely the gates P41, P47, P53, ... P59, etc. It will be obvious that a digital input signal a portion of which is applied to the inputs 70 and another portion to the inputs 71 ultimately results in the selection of one gate from the total number of gates and consequently the selection of one given voltage at one given nodal point of the reference voltage divider. The associated switching transistor is rendered conductive by the selected gate and the desired voltage is applied from the relevant nodal point of the reference voltage divider to the output 62 via the transistor.

All the gates P40 to P63, inclusive, in FIG. 4 are supplied with voltages originating from the bias voltage divider formed by the resistors R64, ... R67. The terminal 63 of this bias voltage divider is connected to all the supply voltage inputs of the gates P40, ... P45, which belong to the first row. The terminal 64 is connected to all the supply voltage inputs of the gates P46, ... P51, which belong to the second row, the terminal 65 is connected to all the power supply terminals of the gates P52, ... P57 which belong to the third row, etc. Although in this manner it is not provided that all the gate-source voltages are equal, it is indeed achieved for the transistors in the selection circuit that the variation within a row is very small, so that the distortion in the output signal is yet effectively counteracted. This significantly reduced distortion is obtained with the aid of a relatively small number of resistors in the setting voltage divider. In addition, because of the matrix structure used, the number of selection signals is considerably decreased, which results in a reduction of the switching noise in the analog signal at the output 59.

FIG. 5 shows the use of a digital-to-analog converter according to the invention in a digital-to-analog converter in which the reference voltage divider is designed as a combination of a coarse ladder network and a fine ladder network. A portion of the components in FIG. 5 is also present in the digital-to-analog converter, already described in the foregoing, of FIG. 4 and these components have been given the same references. This applies more specifically to the row-decoder unit 67, the column-decoder unit 68 and the bias voltage divider formed by the resistors R64, ... R67.

In this embodiment the reference voltage divider is formed by a coarse ladder network and a fine ladder network. The coarse ladder network is formed by the resistors R80, R81, R82, ... R83. By means of this network, the voltage present between the line 61 and the terminal 59 is subdivided in coarse steps. A series arrangement of a number of resistors which together constitute the fine ladder network, is present across the resistors of this coarse ladder network. For the sake of clearness, only a portion of the fine ladder network is provided with references, more specifically that portion that is arranged in parallel with the resistor R83 of the coarse ladder network. This portion of the fine ladder network is constituted by the resistors R90, R91, ... R103. The parallel resistors reduce, on the one hand, the impedance level of the reference voltage divider and, on the other hand, the variation in the effective output impedance in the nodal points of the reference voltage divider is reduced. An additional advantage is that the reference voltage divider can now be realized with resistance values which are attractive for integration without exceeding a predetermined maximum output resistance.

In a similar manner as in FIG. 4, each tap of the fine ladder network is connected to a CMOS-switching transistor which is controlled by a gate. The output terminals of the switching transistors are always connected in groups to a group bus bar. If it is assumed that the transistors are given the same reference numerals as the associated resistors, then all the drain terminals of the transistors T90, ... T104 are connected to the group bus bar 75. Optionally, all these group bus bars can be directly interconnected, or, as is shown in FIG. 5, they can be passed to the output terminal 76 via a separate switching network 77.

FIG. 5a is a schematic circuit diagram of a possible embodiment of the switching network 77. The switching network includes group switches Ts1 ... Ts4 which decouple the group bus bars of the non-selected groups from output terminal 76. The group switches Ts1 ... Ts4 may be CMOS-transistors whose gates are energized by the row-decoder unit 67. If the row-decoder unit 67 selects a given portion of the fine ladder network then the group bus bar associated with the selected portion of the fine ladder network is simultaneously through-connected by the relevant group switch to the output 76. By decoupling all the non-active groups, the parasitic capacitance at output 76 becomes considerably smaller so that the current surges, with which the parasitic capacitance is charged, are then correspondingly lower, which results in the switching noise in the analog output signal to decrease. In addition, the influence of the varying RC-time becomes relatively less.

The hold switches $T_{H1}$ ... $T_{H4}$ are driven inversely relative to the associated group switch (when the group switch is open then the hold switch is closed and vice versa). These switches connect the group bus bars to a fixed potential, in the event the relevant group is not selected. This achieves that the bus bar potential, even if the relevant bar is not through-connected to the output 76 via the switching network 77, is yet kept at a fixed potential, so that drift of the bar potential to unwanted, highly deviating, voltages is prevented. Preferably, for each bar a potential is chosen which is located within the range of voltages which are to be passed-on to the output via the relevant bar. More specifically, a voltage is preferably chosen which is located approximately halfway the voltage range that is to be processed by the relevant group bus bar. This preference is expressed by the connection, shown in FIG. 5a, between $T_{H4}$ and the nodal point between R95 and R96.

FIG. 6 finally shows a further development of an embodiment of a bus bar associated with one of the portions of the fine ladder network. In FIG. 6 one of the resistors of the coarse ladder network is indicated by R110, while the resistors of the corresponding portion of the fine ladder network are denoted by R111 to R118. The associated switching transistors of the selection network are denoted by T111 to T118 and the gate circuits by means of which the relevant transistors are driven, are denoted by P111 to P118.

In this case the group bus bar is constituted by a series arrangement of resistors, which are connected in nodal points and in the embodiment of FIG. 6 comprises the resistors R120 to R123. As has already been described in the foregoing, the impedance at the group bus bar varies in dependence on that tap of the fine ladder network that is switched-through to the output via one of the switching transistors. For the purpose of compensating this impedance variation, the resistors R120 to R123 are now included in the group bus bar in the manner illustrated in FIG. 6. The value of each of the resistors must then be chosen such that the total impedance at the output 76 does not vary or hardly varies anymore, irrespective of the nodal point of the ladder network that is switched through at that instant to the output 76. In the embodiment of FIG. 6 a number of compensating resistors equal to half the number of resistors in the relevant portion of the fine ladder network is required for each portion of the fine ladder network. It is however alternatively possible to obtain a compensation with a smaller number of resistors, for example by excluding the resistors R121 and R123, although the improvement which can be realized will be less.

Finally, it should be noted that the forward resistance of the switching transistors in the selection circuit, that is to say the forward resistance which is measured between the first and the second main electrode of the switching transistors depends on the threshold voltage of the transistors. To eliminate this dependence, or to reduce it to a significant extent, the substrate terminal of the relevant switching transistors is preferably connected to a nodal point of the reference voltage divider. By supplying the substrates of the transistors in this manner with a voltage which varies versus the voltage at the control electrode and also versus the voltage at the first main electrode the threshold voltages of the switching transistors become mutually equal to an improved extent, so that the variation of the forward resistance of the switching transistors decreases.

All the gates used in the digital-to-analog converter as shown in FIGS. 5, 5a and 6, such as the gates P90, .. P103, P111 ... P118 and also all the other gates which are not specifically mentioned, are again supplied, in the same manner as illustrated and described with reference to FIG. 4, with supply voltage originating from a bias voltage divider formed by the resistors R64, ... R67. Thus, all the gates P90, ... P103, for example, are supplied with a voltage obtained from the tap 66 of this bias voltage divider. Also in this case no full equality of all the gate-source-voltages of the several switching transistors is achieved, but indeed a very good approximation thereof, so that ultimately the output signal distortion which would occur if all the gates were supplied with an equal voltage, is still considerably reduced.

We claim:

1. A digital-to-analog converter for converting a digital input signal into an analog output signal, comprising an input for connection of the digital input signal output from which the analog output signal can be taken, a reference voltage divider assembled from a series arrangement of resistance elements interconnected in nodal points, the reference voltage divider having at the ends of the series arrangement terminals for connection of a reference voltage, a selection circuit for coupling one of the nodal points to the analog output in response to selection signals, comprising switching transistors a first main electrode of which is coupled to one of the nodal points, a second main electrode to the analog output and a control electrode to one of the selection signals, and a decoder circuit for activating the selection signals in response to the digital input signal, wherein the digital-to-analog converter further comprises:

a bias voltage divider formed by a series arrangement of resistance elements interconnected in nodal points, the bias voltage divider at the ends of the series arrangement having terminals for connection of a bias voltage, and a level shifting circuit, comprising shifting stages, each having an input terminal, an output terminal and a supply terminal, for shifting a signal level at the input terminal to a different signal level at the output terminal in dependence on the voltage connected to the supply terminal, the input terminals being connected to the selection signals, the output terminals being connected to the control electrodes of the switching transistors corresponding to the selection signals and the supply terminals being connected to the nodal points of the bias voltage divider.

2. A digital-to-analog converter as claimed in claim 1, wherein the series arrangement of the bias voltage divider has the same number of nodal points as the series arrangement of the reference voltage divider.

3. A digital-to-analog converter as claimed in claim 2, wherein the series arrangements of the bias voltage divider and the reference voltage divider are arranged in series.

4. A digital-to-analog converter as claimed in claim 2 wherein the shifting stages each include a transistor having a first and a second main electrode connected to the output terminal and the supply terminal, respectively, and a control electrode connected to the input terminal of the relevant shifting stage.

5. A digital-to-analog converter as claimed in claim 2 wherein the shifting stage is in the form of a logic gate circuit having a logic input connected to the input terminal, a logic output to the output terminal and a supply voltage terminal corresponding to the supply terminal of the shifting stage.

6. A digital-to-analog converter as claimed in claim 1 wherein the series arrangements of the bias voltage divider and the reference voltage divider are arranged in series.

7. A digital-to-analog converter as claimed in claim 6 wherein the shifting stages each include a transistor having a first and a second main electrode connected to the output terminal and the supply terminal, respectively, and a control electrode connected to the input terminal of the relevant shifting stage.

8. A digital-to-analog converter as claimed in claim 6 wherein the shifting stage is in the form of a logic gate circuit having a logic input connected to the input terminal, a logic output to the output connected terminal, and a supply voltage terminal corresponding to the supply terminal of the shifting stage.

9. A digital-to-analog converter as claimed in claim 8, wherein sub-arrangements of equal numbers of consecutive resistance elements of the series arrangement of the reference voltage divider are arranged in groups, the second main electrodes of the switching transistors within the groups being coupled to the analog output via a group bus bar, that the decoding circuit includes a row decoder and a column decoder to activate row selection signals and column selection signals, respectively, that the logic gate circuits are provided with a further logic input which is connected to a further input terminal of the shifting stages, in each of the said groups the said first input terminals all being connected to one of the row selection signals and the further input terminals to different column selection signals.

10. A digital-to-analog converter as claimed in claim 9, wherein a parallel resistance element is arranged in parallel with the sub-arrangements.

11. A digital-to-analog converter as claimed in claim 1, wherein the shifting stages each include a transistor having a first and a second main electrode connected to the output terminal and the supply terminal, respectively, and a control electrode connected to the input terminal of the relevant shifting stage.

12. A digital-to-analog converter as claimed in claim 1, wherein the shifting stage is in the form of a logic gate circuit having a logic input connected to the input terminal, a logic output connected to the output terminal, and a supply voltage terminal corresponding to the supply terminal of the shifting stage.

13. A digital-to-analog converter as claimed in claim 12, wherein sub-arrangements of equal numbers of consecutive resistance elements of the series arrangement of the reference voltage divider are arranged in groups, the second main electrodes of the switching transistors within the groups being coupled to the analog output via a group bus bar, that the decoding circuit includes a row decoder and a column decoder to activate row selection signals and column selection signals, respectively, that the logic gate circuits are provided with a further logic input which is connected to a further input terminal of the shifting stages, in each of said groups said first input terminals all being connected to one of the row selection signals and the further input terminals to different column selection signals.

14. A digital-to-analog converter as claimed in claim 13, wherein a parallel resistance element is arranged in parallel with the sub-arrangements.

15. A digital-to-analog converter as claimed in claim 14, wherein the group bus bar is connected via a group switch to the analog output in response to activation of the row selection signal associated with the group.

16. A digital-to-analog converter as claimed in claim 15, wherein the relevant group further includes a hold switch which connects the group bus bar to a point of fixed potential during non-activation of the row selection signal associated with the group.

17. A digital-to-analog converter as claimed in claim 16, wherein the point of fixed potential is the centermost point of the nodal points of the sub-arrangement of resistance elements of the group.

18. A digital-to-analog converter as claimed in claim 13 or wherein the group bus bar is connected via a group switch to the analog output in response to activation of the row selection signal associated with the group.

19. A digital-to-analog converter as claimed in claim 18, wherein the relevant group further includes a hold switch which connects the group bus bar to a point of fixed potential during non-activation of the row selection signal associated with the group.

20. A digital-to-analog converter as claimed in claim 19, wherein the point of fixed potential is the centermost point of the nodal points of the sub-arrangement of resistance elements of the group.

21. A digital-to-analog converter as claimed in claim 20, wherein the group bus bar is designed as an array of resistance elements interconnected in nodal points, the second main electrodes of the switching transistors of the group being connected to these nodal points.

22. A digital-to-analog converter as claimed in claim 21, wherein a substrate terminal of the switching transistors is connected to a nodal point of the reference voltage divider.

23. A digital-to-analog converter as claimed in claim 13, wherein the group bus bar is designed as an array of resistance elements interconnected in nodal points, the second main electrodes of the switching transistors of the group being connected to these nodal points.

24. A digital-to-analog converter as claimed in claim 1, wherein a substrate terminal of the switching transistors is connected to a nodal point of the reference voltage divider.

* * * * *